United States Patent
Rowe et al.

(10) Patent No.: US 9,595,983 B1
(45) Date of Patent: Mar. 14, 2017

(54) METHOD AND APPARATUS FOR DIGITAL PREDISTORTION OF ULTRA WIDEBAND RADIO FREQUENCY UPCONVERTERS

(71) Applicant: THE UNITED STATES OF AMERICA AS REPRESETNED BY THE SECRETARY OF THE AIR FORCE, Washington, DC (US)

(72) Inventors: Nathaniel W. Rowe, Clinton, NY (US); Dominic M. Lisi, Cicero, NY (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 15/062,244

(22) Filed: Mar. 7, 2016

(51) Int. Cl.
| | |
|---|---|
| *H04L 25/03* | (2006.01) |
| *H04B 1/04* | (2006.01) |
| *H04B 1/62* | (2006.01) |
| *H04B 7/06* | (2006.01) |
| *H04B 10/25* | (2013.01) |
| *H04B 1/00* | (2006.01) |
| *H04B 10/2575* | (2013.01) |
| *H04B 10/40* | (2013.01) |
| *H04B 10/2557* | (2013.01) |
| *H04B 10/2507* | (2013.01) |

(Continued)

(52) U.S. Cl.
CPC ......... *H04B 1/0475* (2013.01); *H04B 1/0007* (2013.01); *H04B 1/62* (2013.01); *H04B 3/32* (2013.01); *H04B 7/0639* (2013.01); *H04B 10/2504* (2013.01); *H04B 10/2507* (2013.01); *H04B 10/2557* (2013.01); *H04B 10/25753* (2013.01); *H04B 10/40* (2013.01); *H04B 15/00* (2013.01); *H04B 17/11* (2015.01); *H04B 17/21* (2015.01); *H04B 2001/0408* (2013.01); *H04B 2001/0425* (2013.01); *H04B 2001/0433* (2013.01)

(58) Field of Classification Search
CPC ... H03F 1/3247; H04L 27/368; H04B 1/0475; H04B 2001/0425; H04B 2001/0408; H04B 1/62; H04B 17/21; H04B 1/0007; H04B 10/40; H04B 2001/0433; H04B 3/32; H04B 7/0639; H04B 10/2504; H04B 10/2507; H04B 10/2557; H04B 10/25753
See application file for complete search history.

(56) References Cited

U.S. PATENT DOCUMENTS 6,496,062 B1 * 12/2002 Nitz ............... H03F 1/3247
330/136
8,238,849 B2 * 8/2012 Pratt ............... H03F 1/3247
330/149

(Continued)

*Primary Examiner* — Janice Tieu
(74) *Attorney, Agent, or Firm* — Joseph A. Mancini

(57) ABSTRACT

Method, apparatus, and article of manufacture for performing digital pre-distortion of wideband analog upconversion chains existing within communications systems. By pre-distorting for the deterministic non-linearities in an analog upconverter, a radiated passband signal will show an improved signal quality which will enhance the ability of a receiver to properly decode received data symbols, as well as perform equalization of the received signal constellation. It is desired that this pre-distortion technique will further improve the signal quality of communication systems who only implement pre-distortion techniques for compression effects due to power amplifiers.

16 Claims, 3 Drawing Sheets

(51) Int. Cl.
  *H04B 3/32* (2006.01)
  *H04B 17/21* (2015.01)
  *H04B 15/00* (2006.01)
  *H04B 17/11* (2015.01)

(56) References Cited

U.S. PATENT DOCUMENTS

2004/0066736 A1* 4/2004 Kroeger ................ H04H 20/30
                                                    370/200
2011/0069749 A1* 3/2011 Forrester ........... H04L 25/03038
                                                    375/232

* cited by examiner

METHOD AND APPARATUS FOR DIGITAL PREDISTORTION OF ULTRA WIDEBAND RADIO FREQUENCY UPCONVERTERS

STATEMENT OF GOVERNMENT INTEREST

The invention described herein may be manufactured and used by or for the Government for governmental purposes without the payment of any royalty thereon.

BACKGROUND OF THE INVENTION

This invention relates generally to high bandwidth radio frequency transmitters, and, more specifically, to ultra wideband radio frequency upconverters wherein analog component nonlinearities may be pre-compensated to improve received signal quality.

As data-rate requirements necessary to support the wireless transmission of high-quality intelligence, surveillance and reconnaissance (ISR) information increase, so do the need for high bandwidth communications systems to support the downlink of this ISR information. One method proposed to enable these high data-rates is to increase wireless signal bandwidths to multi-gigahertz (GHz). Such a signal bandwidth can theoretically support much higher data-rates than traditional kilohertz (kHz) to megahertz (MHz) wide signals, while maintaining realistic modulation schemes that require only moderate signal-to-noise ratios (SNR).

However, existing commercial-off-the-shelf (COTS) microwave frequency components are not designed with the intention of supporting multiple GHz of instantaneous signal bandwidth. Even though these components may support the operation of signals with wide bandwidths, their magnitude and phase response across this band is non-linear. While a narrow-band signal may approach linear operation through an analog component, the wideband nature of a multi-GHz waveform means that some signal components may experience frequency-selective fading that differs significantly from other frequency components across the same instantaneous signal bandwidth. This results in distortion of the waveform and provides a challenge for data recovery techniques at the receiver.

Existing receiver signal equalization techniques may provide some amount of benefit compensate for these non-linearities, but are limited in their capabilities. First, since a receiver does not have information about the ideal transmitted data symbols, the receiver equalizer must blindly attempt to recover the ideal symbols of a signal constellation, then iteratively minimize the identified error. If the received signal is too degraded to determine these ideal symbols, the receiver equalizer will be unable to improve the signal and the received symbols will not be properly decoded. Secondly, as the amount of signal distortion increases due to the effects of non-linear responses in the transmitter and receiver analog hardware, in addition to distortion due to the power amplifier (PA) and wireless channel effects, the burden on the receiver equalizer may become more than it can reasonably compensate for. These facts drive the need for a type of transmitter equalization to improve the response of the signal due to analog component non-linearities.

Pre-distortion of a transmitted radio frequency waveform is necessary when compression of a waveform within a high power amplifier (PA) causes non-linear distortions in the passband signal. Because some amount of this distortion is dependent on the input signal power, temperature stability and PA specifications, given enough information a portion of the distortion can be deterministically modeled. Digital pre-distortion is the practice of purposefully distorting the otherwise ideal digital data before analog transmission to compensate for the deterministic compression caused by the PA.

An optimal solution to the degradation of signal quality of ultra wideband signals through non-linear analog components should be one which is low cost, straightforward to implement and does not require significant changes to existing communication systems. The prior art has been able to isolate some of these parameters independently, but has failed to optimize for all parameters at once.

In U.S. Pat. No. 3,755,754, a pre-distortion technique is described for the compensation of perceived distortion occurring in a signal due to PA non-linearities. In this case, the original signal is separated into two signals where one is distorted through the PA and the other amplified linearly. The signals are then combined with a phase inversion, causing a cancellation of some distortion components. However, this technique targets distortion caused only by the PA while requiring additional analog hardware otherwise unnecessary in the original transmitter.

In U.S. Pat. No. 6,288,610, a method and apparatus for signal pre-distortion is identified which implements a means to detect and compensate for distortion caused by a PA. This technique uses digital pre-distortion techniques, which minimizes the footprint necessary for overall pre-distortion. However, the method requires a second upconverter, PA and power combiner to realize the distortion compensation, significantly impacting the size and cost of the overall technique.

In United States Patent Application Publication 20050088230, an amplifier pre-distortion processing technique is described which uses look-up tables to implement a pre-distortion filter on both the in-phase and quadrature-phase components of a quadrature amplitude modulated waveform. Using look-up tables results in a pre-distortion technique that is less costly to implement and requires a smaller digital footprint than other approaches in the prior art. However, this implementation is used for pre-distortion of a transmitter power amplifier, not the non-linearities of analog components which result in signal degradation of wideband waveforms.

In United States Patent Application Publication 20070153884, a method for calculating the pre-distortion filter coefficients for a closed-loop feedback system is provided. This method updates the pre-distortion coefficients as the characteristics of a PA change over time. While this method is effective for real-time updating, it requires significantly more analog and digital hardware to support the additional downconversion and decoding of the PA-affected signal before transmission.

In U.S. Pat. No. 8,351,877, a digital pre-distortion system and method enables the pre-distortion of a wideband waveform for the distortion effects of a PA. While this invention does address the wideband applications of pre-distortion, the technique is only applied to compensate for PA effects, which results in an incomplete solution to distortion problems.

OBJECTS AND SUMMARY OF THE INVENTION

It is therefore an object of the present invention to provide an apparatus that extends the prior art's use of pre-distortion techniques from not only the non-linear effects of PA compression, but also to the wideband non-linear effects exhibited by analog upconversion components.

It is a further object of the present invention to sufficiently model the steady-state magnitude response of the analog upconversion chain of a transmitter to determine the non-linear effects introduced on the transmission data, through the sounding of the analog components.

It is still a further object of the present invention to develop a finite impulse response filter, whose magnitude response is the inversion of the steady-state magnitude response of the analog upconversion chain, derived using existing mean error minimization techniques.

It is yet still a further object of the present invention to inject the finite impulse response filter coefficients, for each in-phase and quadrature-phase components of a quadrature amplitude modulated waveform, prior to the digital to analog converter of the transmitter, thereby pre-distorting the otherwise ideal data symbols for the known effects of the analog upconversion chain.

It is yet another object of the present invention to provide the aforementioned features as a digital data transmission system apparatus, a method to be applied to a digital data transmission system, or as computer instructions for a computing device acting in cooperation with a digital data transmission system so as to provide the requisite predistortion of digital data transmissions.

Briefly stated, the present invention achieves these and other objects through the use of a finite impulse response pre-distortion filter.

First, a known data sequence is generated of sufficient length to fully characterize an analog upconverter. The sequence should also be of sufficient length to minimize the mean signal error detected on the output of the upconversion chain to some steady state response. Additionally, the data sequence should use the highest order modulation that will be used through the analog components. Finally, the known sequence should include a unique word to be used for synchronization.

Next, the generated sequence is injected into the communications chain of a transmitter immediately before the digital-to-analog converter (DAC). This should be the final stage within the digital modulator, before the signal is converted into the analog domain.

Following that, the digital and analog components of the transmitter should be turned on and allowed to sufficiently warm, such that the local oscillator frequencies and analog components sustain steady-state responses.

After that, the known random data sequence should be transmitted through the digital transmitter, the DAC and the analog upconversion chain. The signal should then be captured at the output of the upconversion chain, before the power amplifier, with a sampling receiver whose analog-to-digital converter (ADC) sampling clock is phase matched to the transmitter DAC clock. The received sampled data and the original ideal data should then be aligned in time using the known unique word, such that each ideal data symbol can also be represented by a corresponding upconverter-effected symbol.

Following that, a negative feedback loop should be implemented, in conjunction with a minimization technique such least mean square or recursive least squares to determine the set of weighted coefficients that minimizes the mean error between the ideal data symbols and the corresponding upconverter-effected symbols. The resultant coefficients represent the inversion of the magnitude response of the analog upconversion chain.

The generated set of coefficients should be injected as a finite impulse response filter directly before the DAC, such that the otherwise ideal transmitted data symbols are pre-distorted to pre-compensate for the non-linearities within the analog upconversion chain.

Therefore, it is accurate to say that while the present invention (1.) utilizes pre-distortion techniques to compensate for signal distortion: (2.) and while the present invention can pre-distort for perceived distortion via a set of digital filter coefficients as prior art requires to achieve the same; the present invention provides a solution lacking in the prior art because it (3.) can pre-distort for the steady-state distortion introduced by analog components acting on a wideband waveform. As such, the present invention represents a significant departure from prior art methods.

According to an embodiment of the invention, apparatus for performing pre-distortion for analog upconversion comprises: a known, ideal, random data sequence to sound an analog upconverter, a means to sample and thereby capture the distorted waveform at the output of the analog upconverter, a digital processor to compare the known, ideal data with the upconverter-effected data, a negative feedback loop with a minimization technique to develop a set of pre-distortion coefficients, and a digital finite impulse response filter that the coefficients can be injected into, thereby pre-distorting the otherwise ideal data symbols.

The above and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
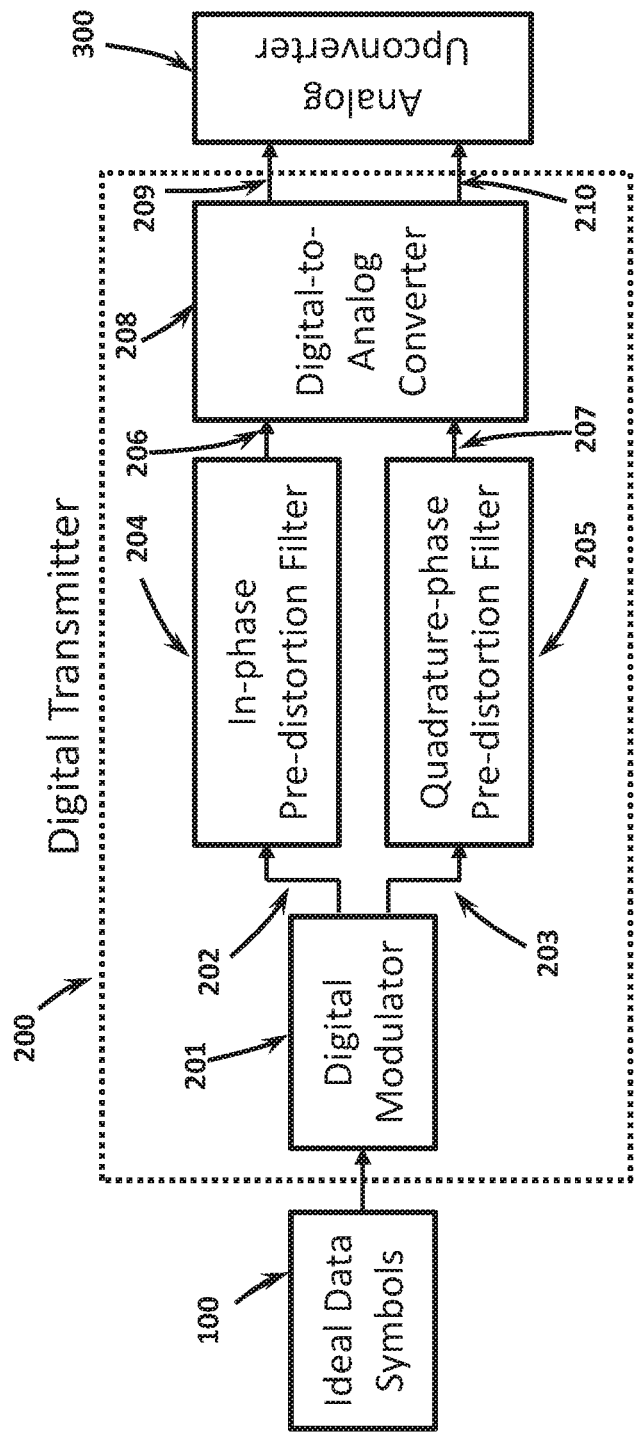
FIG. 1 is a block diagram representation of the digital transmitter, showing the location of the finite impulse response pre-distortion filters.

Referring to FIG. 1, the key components of the digital pre-distortion scheme are the digital data source 100, the digital transmitter 200, and the analog upconverter 300. The digital data source 100 consists of a known serial stream of symbols. Once the pre-distortion filter coefficients are determined, digital data source 100 becomes the intended data to be transmitted.

Still referring to FIG. 1, the data source enters the digital modulator 201 within the digital transmitter 200 where typical digital processing occurs, including, but not limited to, forward error correction and pulse shaping. The output of 201 is a baseband symbol, consisting of an in-phase component 202 and quadrature-phase component 203. These components pass through their respective pre-distortion digital filter 204 and 205. The coefficients of pre-distortion digital filters 204 and 205 are determined according to the process depicted in FIG. 3. The distorted in-phase component 206 and distorted quadrature-phase component 207 feed into the digital-to-analog converter 208. This generates an analog output signal of the digital input values. The outputs of digital-to-analog converter 208 are the in-phase analog signal 209 and quadrature-phase analog signal 210.

Still referring to FIG. 1, the analog signals 209 and 210 are fed into the analog upconverter block 300 where the baseband signals are upconverted to the desired frequency for transmission.

Figure 2:
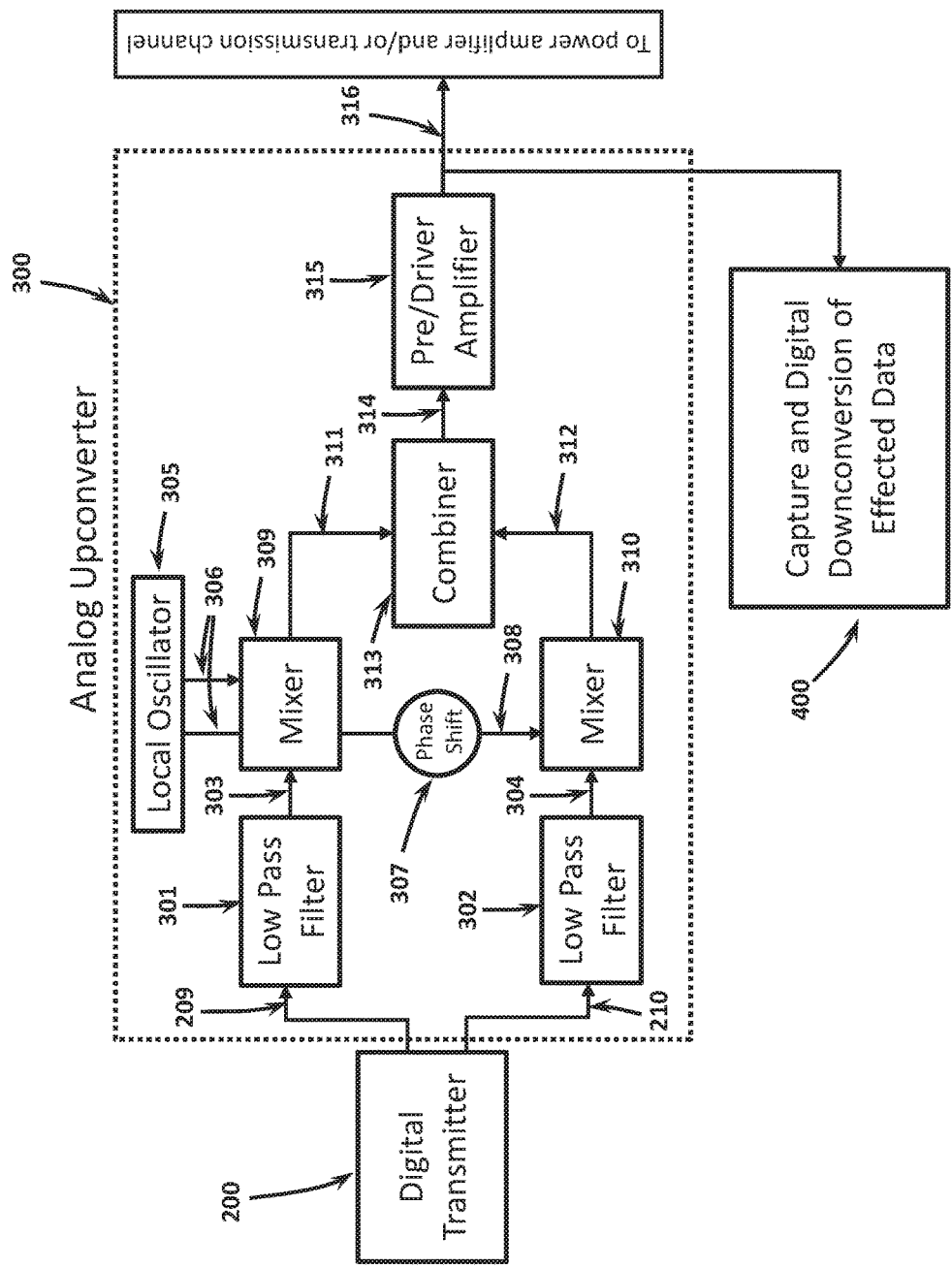
FIG. 2 shows the analog upconversion chain for the in-phase and quadrature-phase components of the wideband waveform, as well as where the capture of the effected symbols occurs.

Referring to FIG. 2, the output of the Digital Transmitter 200 are the analog in-phase signal 209 and analog quadrature-phase signal 210. Both pass through their respective low pass filter 301 and 302 with cut-off frequency of the pulse-shaped bandwidth, yielding signals 303 and 304. A local oscillator 305 generates a sinusoid 306 at the carrier frequency to drive mixers 309 and 310. The sinusoid signal 306 passes through a 90 degree phase shifter 307 to generate sinusoid 308 that is 90 degrees delayed from 306. The in-phase 311 and quadrature 312 signals are combined by 313 to produce a radio frequency signal 314. This signal may pass through a driver amplifier 315 to increase the signal strength loss during the combining stage resulting in 316. This signal is typically fed into a power amplifier or directly into an antenna.

Still referring to FIG. 2, the combined signal 316 is also fed into block 400 for capture and downconversion of the data affected by the analog upconversion chain. This block calculates the filter coefficients utilized within filters 204 and 205.

Figure 3:
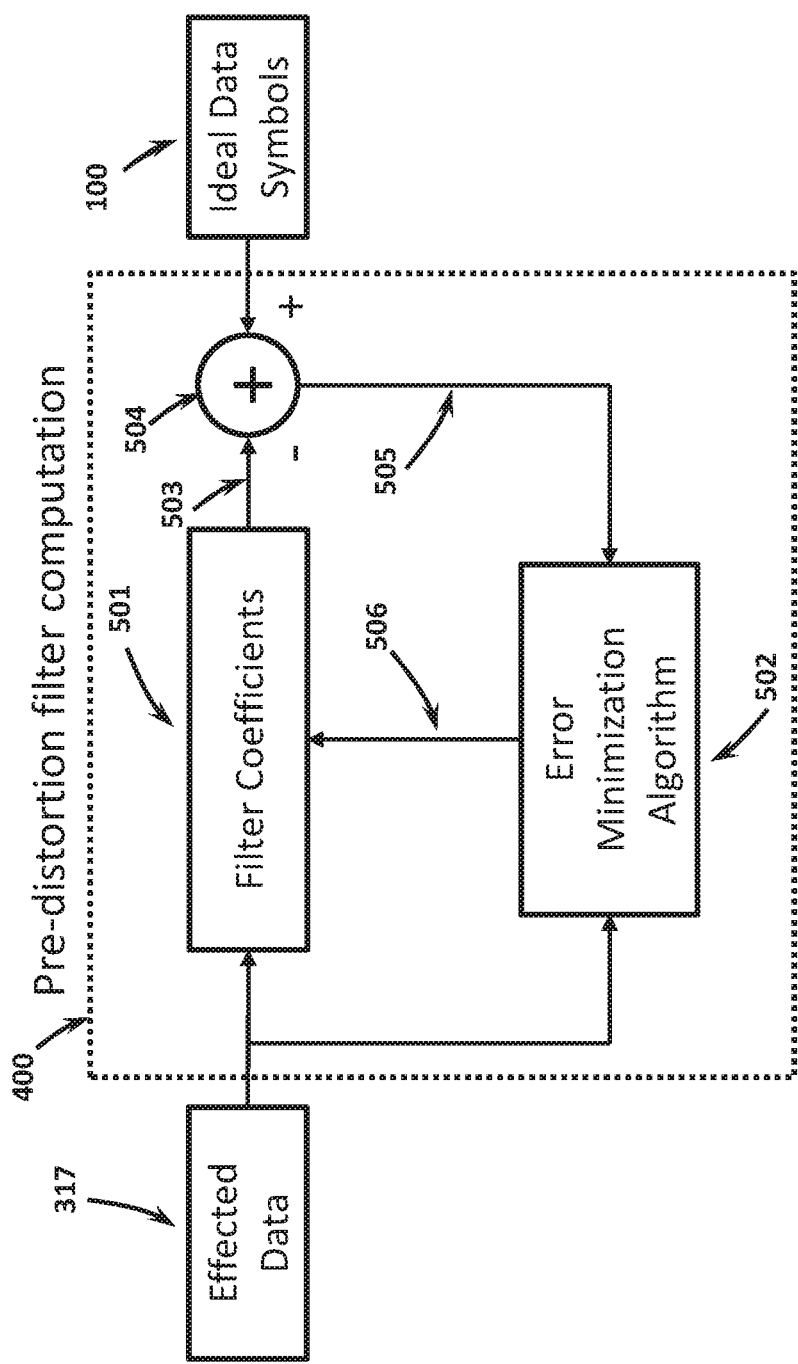
FIG. 3 shows the negative feedback minimization technique to derive the pre-distortion filter coefficients. Note that this process must be completed for both the in-phase and quadrature-phase components of the waveform.

Referring to FIG. 3, the effected data symbols 317 are derived from the analog signal 316 from FIG. 2. It is assumed that the capture, analog downconversion and analog to digital sampling are performed without incurring further distortion of the data symbols. The effected data 317 is passed into the filter coefficient block 501 where it is filtered by a digital finite impulse response filter whose coefficients vary. The output of this filter 503 is subtracted from the ideal data symbols 100 generated at the beginning of this process at block 504. The difference signal 505 is fed into the error minimization algorithm block 502, along with the effected data 317. This block performs a least mean square minimization, generating updated in-phase and quadrature-phase coefficients 506. Once the minimization has converged, these coefficients are assigned to digital filters 204 and 205.

It is important to note that there are many ways to implement the present invention. For example, the invention may be implemented in electronic hardware comprising analog, digital, and computer circuitry. Certain aspects of the invention may be implemented in computer software, either as software instructions fixed in a non-transitory tangible storage media or as firmware, fixed in electronic circuitry.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A method for predistorting data transmissions in a digital data transmission system, comprising the steps of:
   generating an ideal data symbol sequence and digitally modulating said ideal data symbol sequence prior to digital-to-analog conversion;
   permitting said digital data transmission system to reach steady-state operation;
   upconverting said ideal data symbol sequence and sampling all upconverted ideal data symbol sequences prior to power amplification so as to produce a sampled data sequence;
   aligning a received sampled data sequence in time with said ideal data symbol sequence;
   determining a mean error between said ideal data symbol sequence and a corresponding upconverter-effected data symbol sequence;
   generating weighted coefficients which minimize said mean error; and
   applying said weighted coefficients to a step of pre-distortion filtering so as to pre-distort said data transmissions.

2. The method of claim 1, wherein said step of digitally modulating modulates said ideal data symbol sequence to the highest order of modulation employed in said data transmission system.

3. The method of claim 1, wherein said step of digitally modulating occurs as a final step of digital modulation within said digital transmission system.

4. The method of claim 1, wherein said step of sampling further comprises analog-to-digital conversion of said upconverted ideal data symbol sequence.

5. The method of claim 1, wherein said step of aligning said received sampled data sequence in time with said ideal data symbol sequence further comprises:
   phase matching a sampling clock of said analog-to-digital conversion to a sampling clock of said digital-to-analog conversion; and
   aligning each symbol of said received sampled data sequence with each corresponding symbol of said ideal data symbol sequence.

6. The method of claim 1, wherein said step of injecting said weighted coefficients further comprises finite impulse response filtering said upconverter-effected data symbol sequence.

7. The method of claim 1, wherein said step of digitally modulating produces in-phase and quadrature phase components of said data transmissions and ideal data symbol transmissions.

8. A digital data transmission system having means for predistorting data transmissions therethrough to compensate for non-linear data distortions, said digital data transmission system comprising:
   a digital transmitter;
   an analog upconverter;
   a predistortion filter; and
   a power amplifier; wherein
      said predistortion filter:
         samples upconverted data transmissions at the output of said analog upconverter and prior to amplification in said power amplifier;
         determines a mean error between ideal data symbol sequences and corresponding upconverter-effected symbols comprising said data transmissions;
         generates weighted coefficients so as to minimize said mean error; and
         feeds back said weighted coefficients into said digital transmitter so as to pre-distort said data transmissions.

9. The digital data transmission system of claim 8, wherein said digital transmitter operates at its highest order of modulation while said weighed coefficients are being generated.

10. An article of manufacture comprising non-transitory storage medium and a plurality of computer instructions stored therein, said computer instructions configured so as to cause a computing device, acting in cooperation with a digital data transmission system, to perform the following steps so as to cause predistortion of data transmissions in said digital data transmission system:
- generating an ideal data symbol sequence and digitally modulating said ideal data symbol sequence prior to digital-to-analog conversion;
- permitting said digital data transmission system to reach steady-state operation;
- upconverting said ideal data symbol sequence and sampling all upconverted ideal data symbol sequences prior to power amplification so as to produce a received sampled data sequence;
- aligning said received sampled data sequence in time with said ideal data symbol sequence;
- determining a mean error between said ideal data symbol sequence and a corresponding upconverter-effected data symbol sequence;
- generating weighted coefficients which minimize said mean error; and
- applying said weighted coefficients to a step of pre-distortion filtering so as to pre-distort said data transmissions.

11. The article of manufacture of claim 10, wherein said step of digitally modulating modulates said ideal data symbol sequence to the highest order of modulation employed in said data transmission system.

12. The article of manufacture of claim 10, wherein said step of digitally modulating occurs as a final step of digital modulation within said digital transmission system.

13. The article of manufacture of claim 10, wherein said step of sampling further comprises analog-to-digital conversion of said upconverted ideal data symbol sequence.

14. The article of manufacture of claim 10, wherein said step of aligning said received sampled data sequence in time with said ideal data symbol sequence further comprises:
- phase matching a sampling clock of said analog-to-digital conversion to a sampling clock of said digital-to-analog conversion; and
- aligning each symbol of said received sampled data sequence with each corresponding symbol of said ideal data symbol sequence.

15. The article of manufacture of claim 10, wherein said step of injecting said weighted coefficients further comprises finite impulse response filtering said upconverter-effected data symbol sequence.

16. The article of manufacture of claim 10, wherein said step of digitally modulating produces in-phase and quadrature phase components of said data transmissions and said ideal data symbol transmissions.

* * * * *